United States Patent
Wang et al.

(10) Patent No.: US 8,536,038 B2
(45) Date of Patent: Sep. 17, 2013

(54) MANUFACTURING METHOD FOR METAL GATE USING ION IMPLANTATION

(75) Inventors: Shao-Wei Wang, Taichung (TW);
Yu-Ren Wang, Tainan (TW);
Chien-Liang Lin, Taoyuan County (TW); Wen-Yi Teng, Ksohsiung (TW); Tsuo-Wen Lu, Kaohsiung (TW); Chih-Chung Chen, Tainan (TW); Ying-Wei Yen, Miaoli County (TW); Yu-Min Lin, Tainan (TW); Chin-Cheng Chien, Tainan (TW); Jei-Ming Chen, Tainan (TW); Chun-Wei Hsu, Taipei (TW); Chia-Lung Chang, Tainan (TW); Yi-Ching Wu, Kaohsiung (TW); Shu-Yen Chan, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 190 days.

(21) Appl. No.: 13/164,781

(22) Filed: Jun. 21, 2011

(65) Prior Publication Data
US 2012/0329261 A1     Dec. 27, 2012

(51) Int. Cl.
*H01L 21/3205*     (2006.01)
*H01L 21/425*      (2006.01)

(52) U.S. Cl.
USPC ......................................... 438/589; 438/514

(58) Field of Classification Search
None
See application file for complete search history.

(56) References Cited

U.S. PATENT DOCUMENTS

| | | | |
|---|---|---|---|
| 6,066,533 A | 5/2000 | Yu | |
| 6,303,418 B1 * | 10/2001 | Cha et al. | 438/199 |
| 6,492,217 B1 | 12/2002 | Bai et al. | |
| 6,552,377 B1 | 4/2003 | Yu | |
| 6,586,288 B2 * | 7/2003 | Kim et al. | 438/183 |
| 6,696,345 B2 | 2/2004 | Chau et al. | |
| 6,790,719 B1 | 9/2004 | Adetutu et al. | |
| 6,794,234 B2 | 9/2004 | Polishchuk et al. | |
| 6,902,969 B2 | 6/2005 | Adetutu et al. | |
| 6,921,711 B2 | 7/2005 | Cabral, Jr. et al. | |
| 7,030,430 B2 | 4/2006 | Doczy et al. | |
| 7,074,664 B1 | 7/2006 | White et al. | |
| 7,109,079 B2 | 9/2006 | Schaeffer, III et al. | |
| 7,126,199 B2 | 10/2006 | Doczy et al. | |
| 7,157,378 B2 | 1/2007 | Brask et al. | |
| 7,193,893 B2 | 3/2007 | Forbes | |
| 7,208,366 B2 | 4/2007 | Tsai | |
| 7,381,619 B2 | 6/2008 | Wang et al. | |
| 7,390,709 B2 | 6/2008 | Doczy et al. | |
| 7,439,113 B2 * | 10/2008 | Doczy et al. | 438/157 |
| 7,488,656 B2 | 2/2009 | Cartier et al. | |
| 7,564,102 B2 * | 7/2009 | Yoshihara | 257/369 |
| 7,785,958 B2 | 8/2010 | Doczy et al. | |
| 8,198,152 B2 * | 6/2012 | Beyer et al. | 438/199 |
| 2002/0127888 A1 | 9/2002 | Cho et al. | |
| 2005/0095763 A1 | 5/2005 | Samavedam et al. | |
| 2005/0202659 A1 | 9/2005 | Li et al. | |
| 2005/0275035 A1 | 12/2005 | Mathew et al. | |

(Continued)

*Primary Examiner* — Scott B Geyer
(74) *Attorney, Agent, or Firm* — Winston Hsu; Scott Margo (57) ABSTRACT

A manufacturing method for a metal gate includes providing a substrate having at least a semiconductor device with a conductivity type formed thereon, forming a gate trench in the semiconductor device, forming a work function metal layer having the conductivity type and an intrinsic work function corresponding to the conductivity type in the gate trench, and performing an ion implantation to adjust the intrinsic work function of the work function metal layer to a target work function.

35 Claims, 5 Drawing Sheets

(56) References Cited

U.S. PATENT DOCUMENTS

| | | |
|---|---|---|
| 2006/0040482 A1 | 2/2006 | Yang et al. |
| 2006/0054943 A1 | 3/2006 | Li et al. |
| 2007/0037335 A1 | 2/2007 | Chambers et al. |
| 2007/0082445 A1 | 4/2007 | Yang et al. |
| 2007/0138559 A1 | 6/2007 | Bohr |
| 2007/0148838 A1 | 6/2007 | Doris et al. |
| 2007/0210354 A1 | 9/2007 | Nabatame et al. |
| 2008/0076216 A1 | 3/2008 | Pae et al. |
| 2008/0318371 A1 | 12/2008 | Lin et al. |
| 2009/0057787 A1 | 3/2009 | Matsuki et al. |
| 2009/0166769 A1 | 7/2009 | Metz et al. |
| 2010/0052074 A1 | 3/2010 | Lin et al. |
| 2010/0068877 A1 | 3/2010 | Yeh et al. |
| 2010/0081262 A1 | 4/2010 | Lim et al. |

* cited by examiner

MANUFACTURING METHOD FOR METAL GATE USING ION IMPLANTATION

BACKGROUND OF THE INVENTION

1. Field of the Invention

The invention relates to a manufacturing method for a metal gate, and more particularly, to a manufacturing method for a metal gate integrated with the gate last process.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high dielectric constant (hereinafter abbreviated as high-k) materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability such as ensure the metal gate of the n-type metal-oxide-semiconductor (nMOS) having a work function of about 4.1 eV and the metal gate of the p-type MOS (pMOS) having a work function of about 5.1 eV even though the conventional silicon dioxide or silicon oxynitride gate dielectric layer is replaced by the high-K gate dielectric layer and the conventional polysilicon gate is replaced by the metal gate.

SUMMARY OF THE INVENTION

According to an aspect of the present invention, a manufacturing method for a metal gate is provided. The manufacturing method includes providing a substrate having at least a semiconductor device with a conductivity type formed thereon, forming a gate trench in the semiconductor device, forming a work function metal layer having the conductivity type and an intrinsic work function corresponding to the conductivity type in the gate trench, and performing an ion implantation to adjust the intrinsic work function of the work function metal layer to a target work function.

According another aspect of the present invention, a manufacturing method for metal gates is further provided. The manufacturing method includes providing a substrate having at least a first semiconductor device and a second semiconductor device formed thereon, the first semiconductor device having a first conductivity type, the second semiconductor device having a second conductivity type, and the first conductivity type and the second conductivity type being complementary; forming a first gate trench and a second gate trench respectively in the first semiconductor device and the second semiconductor device; forming a first work function metal layer in the first gate trench, the first work function metal layer having the first conductivity type and a first intrinsic work function corresponding the first conductivity type; performing a first ion implantation to adjust the first intrinsic work function to a first target work function; removing a portion of the first work function metal layer to expose a bottom of the second gate trench; forming a second work function metal layer in the second gate trench, the second work function metal layer having the second conductivity type and a second intrinsic work function corresponding to the second conductivity type; and performing a second ion implantation to adjust the second intrinsic work function to a second target work function.

According to the manufacturing method for a metal gate provided by the present invention, the p-type or n-type work function metal layer having the intrinsic work function is formed in the corresponding p-type or n-type semiconductor device and followed by performing the ion implantation to implant specific dopants into the p-type or n-type work function metal layer. Thus the intrinsic work function is adjusted to a target work function that fulfills the requirement to a metal gate of the p-type or n-type semiconductor device. In other words, the manufacturing method for a metal gate provided by the present invention ensures the p-type or n-type semiconductor device obtains a metal gate having the work function fulfilling its requirement and thus ensures the performance of the p-type or n-type semiconductor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are drawings illustrating a manufacturing method for metal gates, wherein

DETAILED DESCRIPTION

Figure 1:
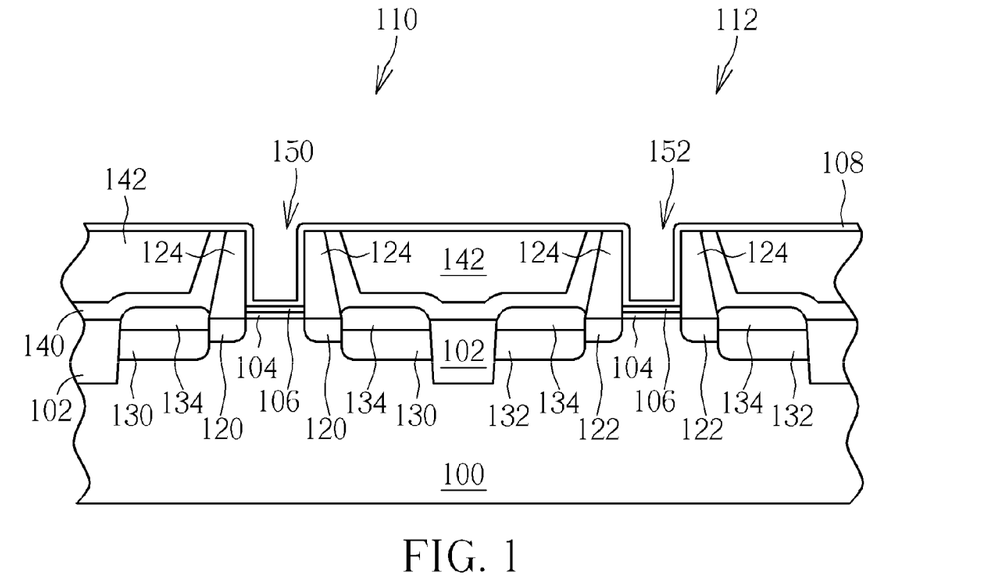

Please refer to FIGS. 1-10, which are drawings illustrating a manufacturing method for metal gates provided by a preferred embodiment of the present invention. As shown in FIG. 1, the preferred embodiment first provides a substrate 100 such as a silicon substrate, silicon-containing substrate, or silicon-on-insulator (SOI) substrate. The substrate 100 includes a first semiconductor device 110 and a second semiconductor device 112 formed thereon. And a shallow trench isolation (STI) 102 is formed in the substrate 100 between the first semiconductor device 110 and the second semiconductor device 112 for providing electrical isolation. The first semiconductor device 110 includes a first conductivity type, the second semiconductor device 112 includes a second conductivity type, and the first conductivity type and the second conductivity type are complementary. In the preferred embodiment, the first conductivity type is a p-type and the second conductivity type is an n-type, however those skilled in the art would easily realize that it is not limited to have the first conductivity type being the n-type and the second conductivity type being the p-type.

Please refer to FIG. 1. The first semiconductor device 110 and the second semiconductor device 112 respectively includes a gate dielectric layer 104, a bottom barrier layer 106 and a dummy gate such as a polysilicon layer (not shown). The gate dielectric layer 104 can be a conventional silicon oxide ($SiO_2$) layer, a high-K gate dielectric layer, or its combination. The bottom barrier layer 106 can include titanium nitride (TiN), but not limited to this. Furthermore, the first semiconductor device 110 and the second semiconductor device 112 respectively includes first lightly doped drains (LDDs) 120 and second LDDs 122, a spacer 124, a first source/drain 130 and a second source/drain 132. It is well-known to those skilled in the art that selective strain scheme (SSS) can be used in the preferred embodiment. For example, a selective epitaxial growth (SEG) method can be used to form the first source/drain 130 and the second source/drain 132. Since the first semiconductor device 110 is a p-type semiconductor device and the second semiconductor device 112 is an n-type semiconductor device, epitaxial silicon layers with silicon germanium (SiGe) are used to form the p-type source/drain 130 and epitaxial silicon layers with silicon carbide (SiC) can be used to form the n-type source/drain 132. Additionally, salicides 134 are formed on the first source/drain 130 and the second source/drain 132. After forming the first semiconductor device 110 and the second semiconductor device 112, a contact etch stop layer (CESL) 140 and an inter-layer dielectric (ILD) layer 142 are sequentially formed. Since the steps and material choices for the abovementioned elements are well-known to those skilled in the art, those details are omitted herein in the interest of brevity.

Please still refer to FIG. 1. After forming the CESL 140 and the ILD layer 142, a planarization process is performed to remove a portion of the CESL 140 and a portion of the ILD layer 142 to expose the dummy gates of the first semiconductor device 110 and the second semiconductor device 112. Then, a suitable etching process is performed to remove the dummy gates of the first semiconductor device 110 and the second semiconductor device 112, and thus a first gate trench 150 and a second gate trench 152 are respectively formed in the first semiconductor device 110 and the second semiconductor device 112. It is noteworthy that the preferred embodiment is integrated with the high-k first process; therefore the gate dielectric layer 104 includes high-k materials such as rare earth metal oxide. The high-k gate dielectric layer 104 can include material selected from the group consisting of as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Additionally, an interfacial layer (not shown) can be formed in between the high-k gate dielectric layer 104 and the substrate 100. After forming the first gate trench 150 and the second gate trench 152, an etch stop layer 108 can be formed on the bottom barrier layer 106 in both of the first gate trench 150 and the second gate trench 152. Accordingly, the etch stop layer 108 is exposed in bottoms of the first gate trench 150 and the second gate trench 152. The etch stop layer 108 can include tantalum nitride (TaN), but not limited to this.

Figure 2:
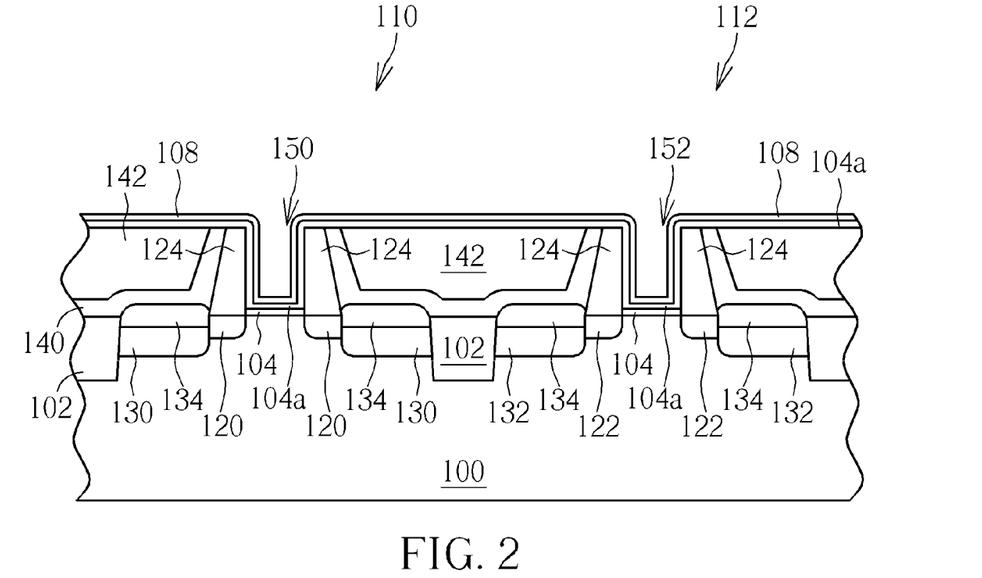
FIG. 2 is drawing illustrating a modification to the preferred embodiment.

Please refer to FIG. 2, which is drawing illustrating a modification to the preferred embodiment. As shown in FIG. 2, the modification is integrated with the high-k last process; therefore the gate dielectric layer 104 includes a conventional $SiO_2$ layer. After removing the polysilicon layer to form the first gate trench 150 and the second gate trench 152, the gate dielectric layer 104 exposed in the bottoms of the first gate trench 150 and the second gate trench 152 serves as an interfacial layer. Next, a high-k gate dielectric layer 104a is formed on the substrate 100. The high-k gate dielectric layer 104 includes materials as mentioned above. As shown in FIG. 2, the high-k gate dielectric layer 104a formed in the first gate trench 150 and the second gate trench 152 have a U shape and covers the bottoms and sidewalls of the first gate trench 150 and the second gate trench 152. After forming the high-k gate dielectric layer 104a, the etch stop layer 108 is formed on the high-k gate dielectric layer 104a.

Figure 3:
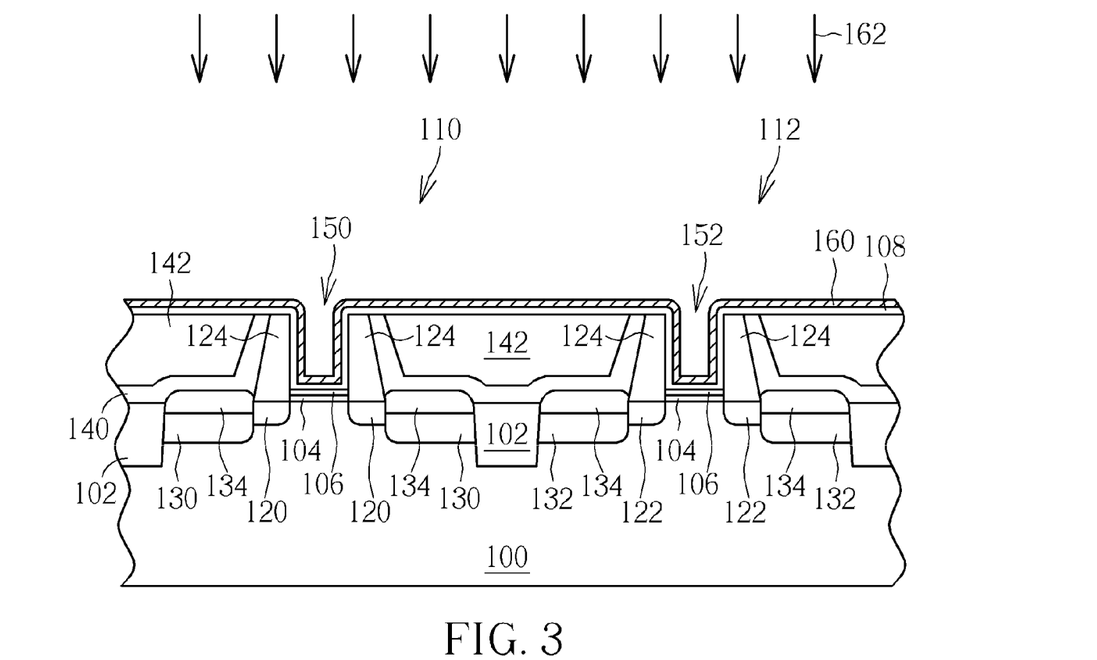

Please refer to FIG. 3. After forming the etch stop layer 108 as shown in FIG. 1 or FIG. 2, a chemical vapor deposition (CVD) or a physical vapor deposition (PVD) is performed to form a first work function metal layer 160 in the first gate trench 150 and the second gate trench 152. The first work function metal layer 160 includes an intrinsic work function that is corresponding to the conductivity type of the first semiconductor device 110. That means the first work function metal layer 160 is a p-type work function metal layer and exemplarily includes TiN, TaN, titanium carbide (TiC), tantalum carbide (TaC), tungsten carbide (WC), or aluminum titanium nitride (TiAlN), but not limited to this. In addition, the first work function metal layer 160 can be a single-layered structure or a multi-layered structure.

Please still refer to FIG. 3. After forming the first work function metal layer 160, an ion implantation 162 is performed to implant aluminum (Al), nitrogen (N), chlorine (Cl), oxygen (O), fluorine (F), or bromine (Br) into the first work function metal layer 160. Thus the intrinsic work function of the first work function metal layer 160 is adjusted to a target work function, and the target work function is between 4.9 eV and 5.2 eV. Preferably the target work function is 5.1 eV.

Figure 4:
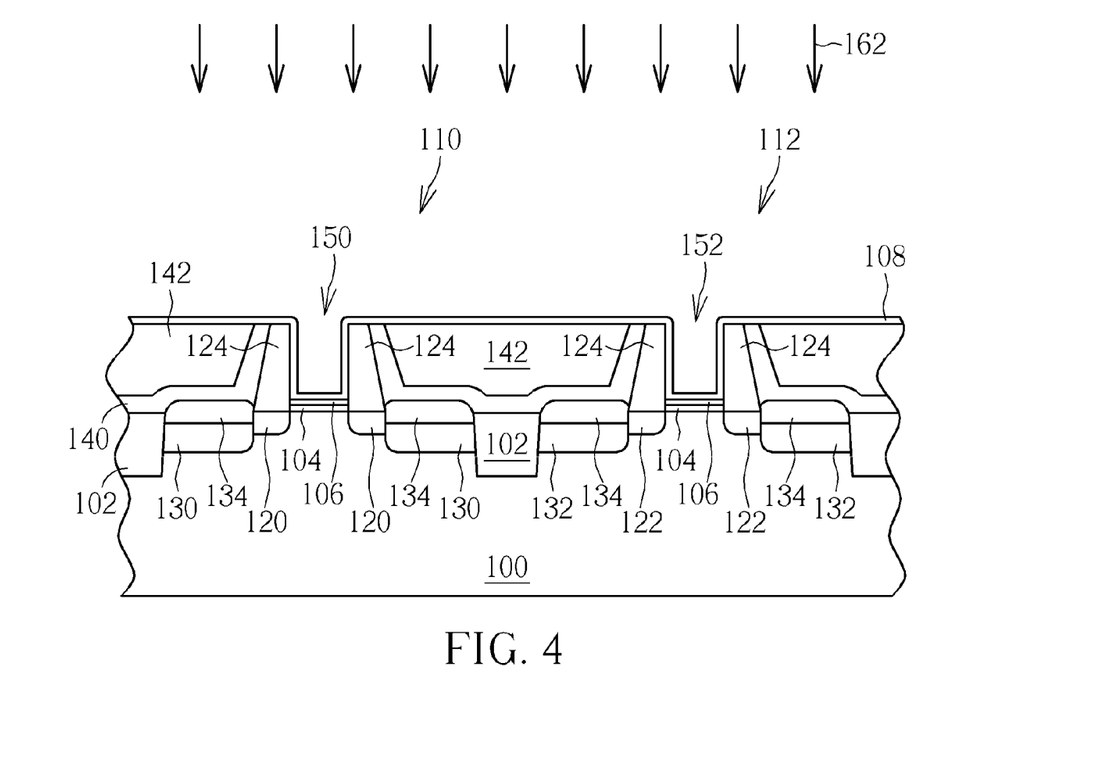
FIG. 4 is a drawing illustrating another modification to the preferred embodiment.

Furthermore, the ion implantation 162 can be performed before forming the first work function metal layer 160: Please refer to FIG. 4, which is a drawing illustrating another modification to the preferred embodiment. As shown in FIG. 4, the modification is to perform the ion implantation 162 after forming the etch stop layer 108 but before forming the first work function metal layer 160. Accordingly, dopants such as Al, N, Cl, O, F, or Br are implanted into the etch stop layer 108. After the ion implantation 162, the first work function metal layer 160 is formed in the first gate trench 150 and the second gate trench 152.

Figure 5:
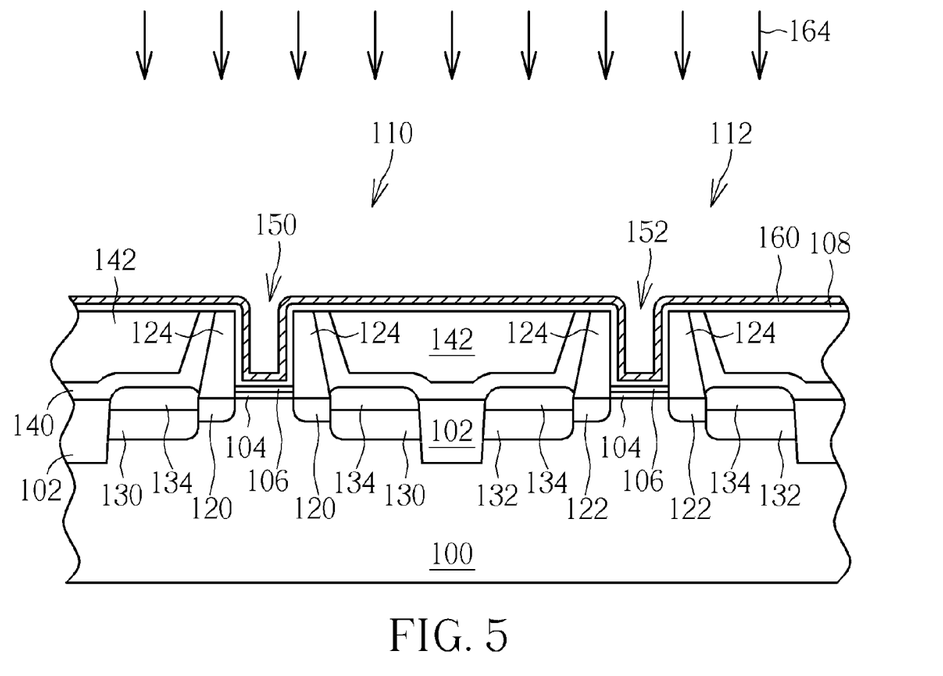

After performing the ion implantation 162 and forming the first work function metal layer 160, a thermal treatment 164 is performed to drive the dopants in the etch stop layer 108 to the first work function metal layer 160 for adjusting the intrinsic work function of the first work function metal layer 160 to the target work function. Additionally, the thermal treatment 164 further includes introduction of oxygen that involves adjustment to the intrinsic work function of the first work function metal layer 160. It is noteworthy that the thermal treatment 164 is also performed after the ion implantation 162 that is performed after forming the first work function metal layer 160 as shown in FIG. 5. Thus result of the adjustment to the intrinsic work function of the first work function metal layer 160 is improved. However, when the ion implantation 162 has already adjusted the intrinsic work function of the first work function metal layer 160 to the target work function, the thermal treatment 164 can be eliminated. In other words, when the ion implantation 162 provided by the preferred embodiment has already adjusted the intrinsic work function of the first work function metal layer 160 to the target work function, the thermal treatment 164 is replaced by the ion implantation 162 according to the preferred embodiment.

Figure 6:
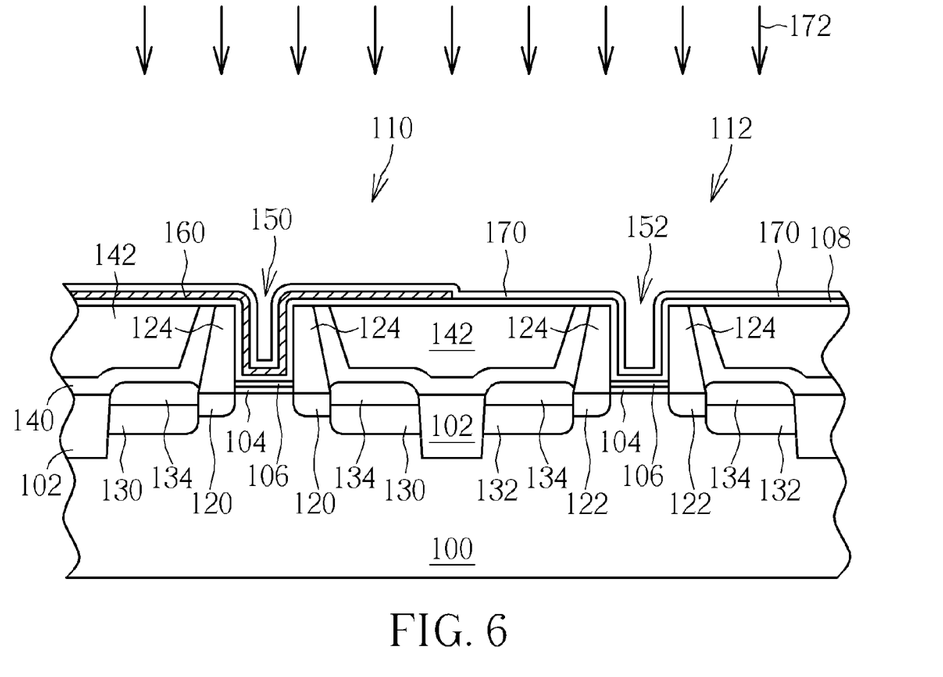

Please refer to FIG. 6. Next, a patterned mask is formed on the substrate 100. The patterned mask can be a patterned photoresist layer (not shown), but not limited to this. The patterned mask covers the first semiconductor device 110 and exposes the first work function metal layer 160 in the second semiconductor device 112. Then, a suitable etchant is used to remove the first work function metal layer 160 not cover by the patterned mask to expose the etch stop layer 108 in the second gate trench 152. During removing the first work function metal layer 160, the etch stop layer 108 renders protection to the underneath bottom barrier layer 106 and high-k gate dielectric layer 104. It is noteworthy that for improving the gap-filling result of the following formed metal materials, the patterned mask can be formed only in the first gate trench 150 and a surface of the patterned mask is lower than the opening of the first gate trench 150. Accordingly, the first work function metal layer 160 not covered by the patterned mask is removed and the remained first work function metal layer 160 is left only in the first gate trench 160, particularly on the bottom and sidewalls of the first gate trench 160. That means a height of the remained first work function metal layer 160 is smaller than a depth of the first gate trench 150. Consequently, the gap-filling result of the following formed metal materials can be improved.

Please still refer to FIG. 6. After removing the first work function metal layer 160 from the second gate trench 152, a CVD process or a PVD process is performed to form a second work function metal layer 170 on the substrate 100. The second work function metal layer 170 includes an intrinsic work function that is corresponding to the conductivity type of the second semiconductor device 120. That means the second work function metal layer 170 is an n-type work function metal layer. Additionally, the second work function metal layer 170 can be a single-layered structure or a multi-layered structure. In the preferred embodiment, the second work function metal layer 170 can be a metal layer preferably a Ti layer formed by the CVD process or the PVD process. And a Al ion implantation 172 is performed after forming the Ti layer for implanting Al into the metal layer. Thus, the second work function metal layer 170 such as a TiAl layer is formed and the intrinsic work function of the second work function metal layer 170 is pre-adjusted.

Furthermore, the second work function metal layer 170 provided by the preferred embodiment can be a titanium aluminide (TiAl) layer, a zirconium aluminide (ZrAl) layer, a tungsten aluminide (WAl) layer, a tantalum aluminide (TaAl) layer, or a hafnium aluminide (HfAl) layer formed by the CVD process or the PVD process, but not limited to this. Moreover, after forming the TiAl layer, the ZrAl layer, the WAl layer, the TaAl layer, or the HfAl layer, the Al ion implantation 172 is performed to implant Al into the second work function metal layer 170 for adjusting an Al concentration of the second work function metal layer 170 and pre-adjusting the intrinsic work function of the second work function metal layer 170.

Figure 7:
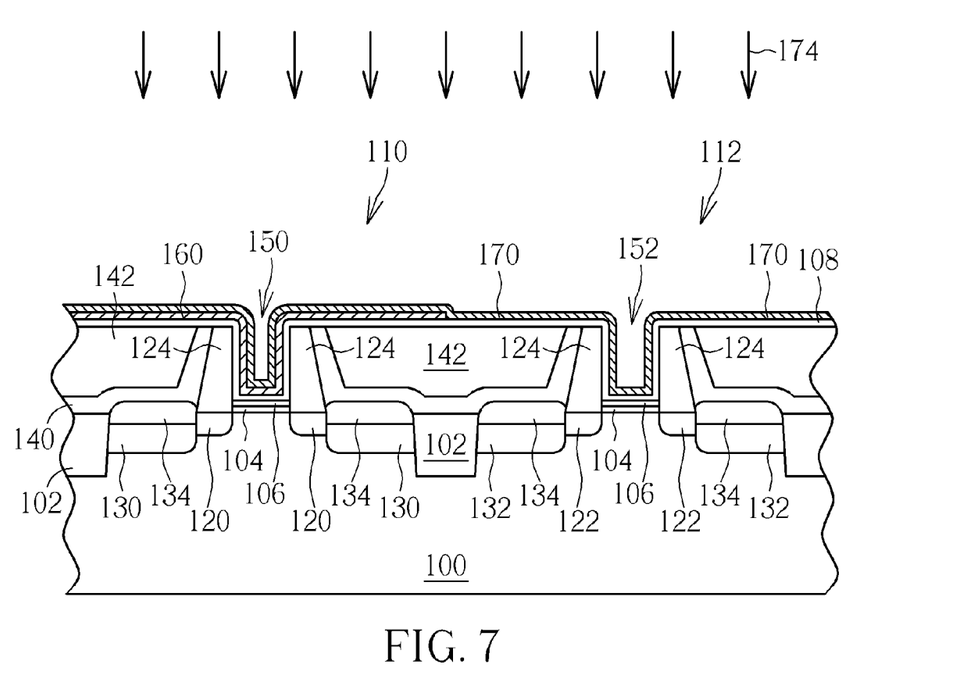

Please refer to FIG. 7. After forming the second work function metal layer 170, an ion implantation 174 is performed to implant lanthanum (La), zirconium (Zr), hafnium (Hf), titanium (Ti), aluminum (Al), niobium (Nb) or tungsten (W) into the second work function metal layer 170. Thus the intrinsic work function of the second work function metal layer 170 is adjusted to a target work function, and the target work function is between 3.9 eV and 4.2 eV. Preferably the target work function is 4.1 eV.

Figure 8:
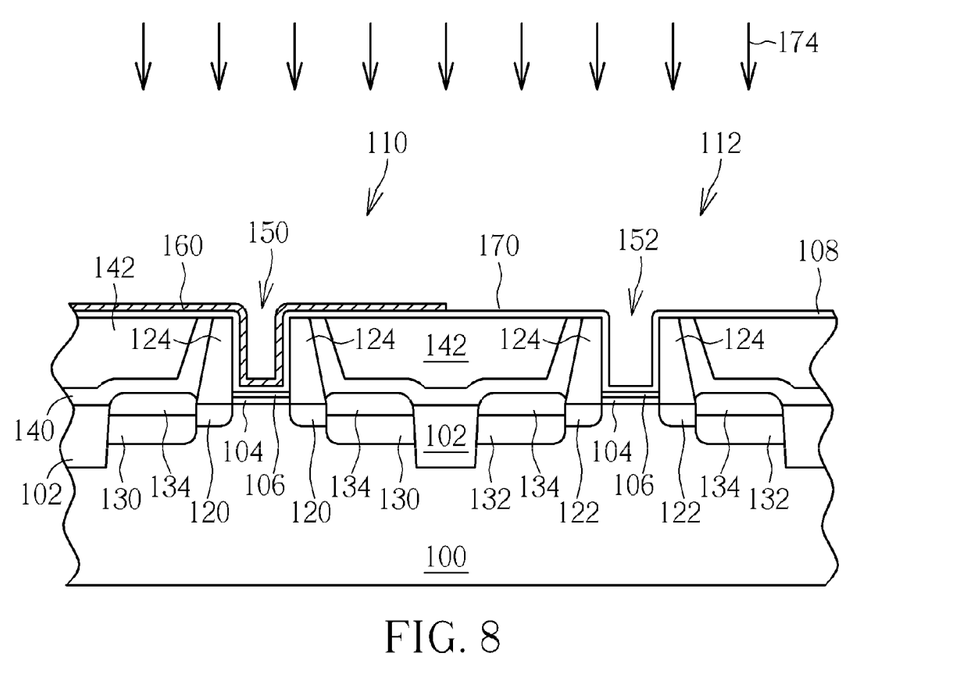
FIG. 8 is a drawing illustrating still another modification to the preferred embodiment.

Furthermore, the ion implantation 174 can be performed before forming the second work function metal layer 170: Please refer to FIG. 8, which is a drawing illustrating another modification to the preferred embodiment. As shown in FIG. 8, the modification is to perform the ion implantation 174 after removing the first work function metal layer 160 and exposing the etch stop layer 108, but before forming the second work function metal layer 170. Accordingly, dopants such as La, Zr, Hf, Ti, Al, Nb, or W are implanted into the etch stop layer 108. After the ion implantation 174, the second work function metal layer 170 is formed on the substrate 100.

Figure 9:
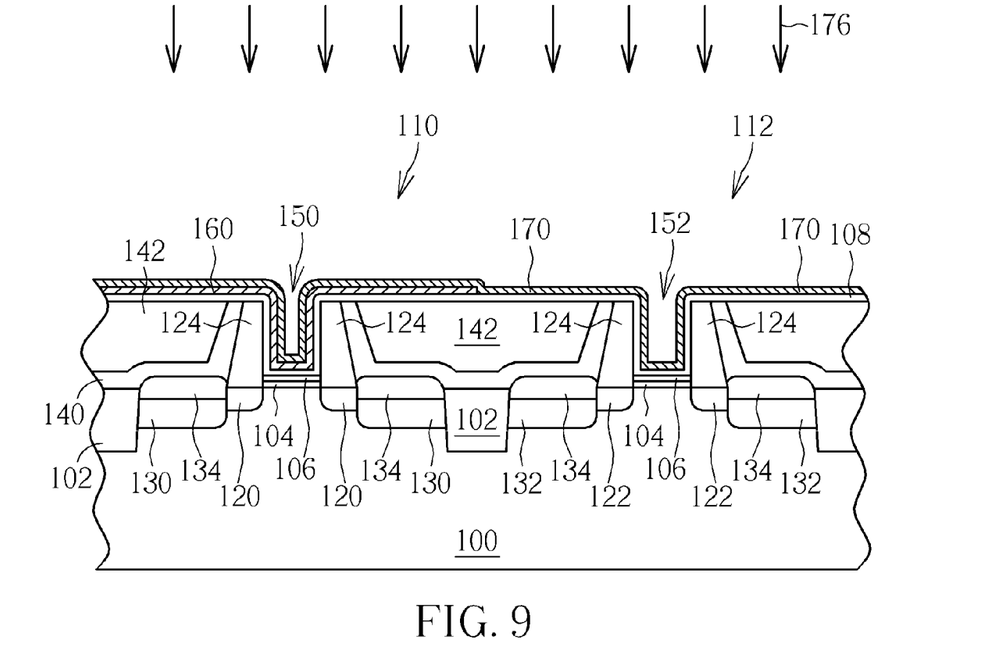

After performing the ion implantation 174 and forming the second work function metal layer 170, a thermal treatment 176 is performed to drive the dopants in the etch stop layer 108 to the second work function metal layer 170 for adjusting the intrinsic work function of the second work function metal layer 170 to the target work function. Additionally, the thermal treatment 176 further includes introduction of nitrogen for densifying the second work function metal layer 170. It is noteworthy that the thermal treatment 176 is also performed after the ion implantation 174 that is performed after forming the second work function metal layer 170 as shown in FIG. 9. Thus result of the adjustment to the intrinsic work function of the second work function metal layer 170 is improved.

Figure 10:
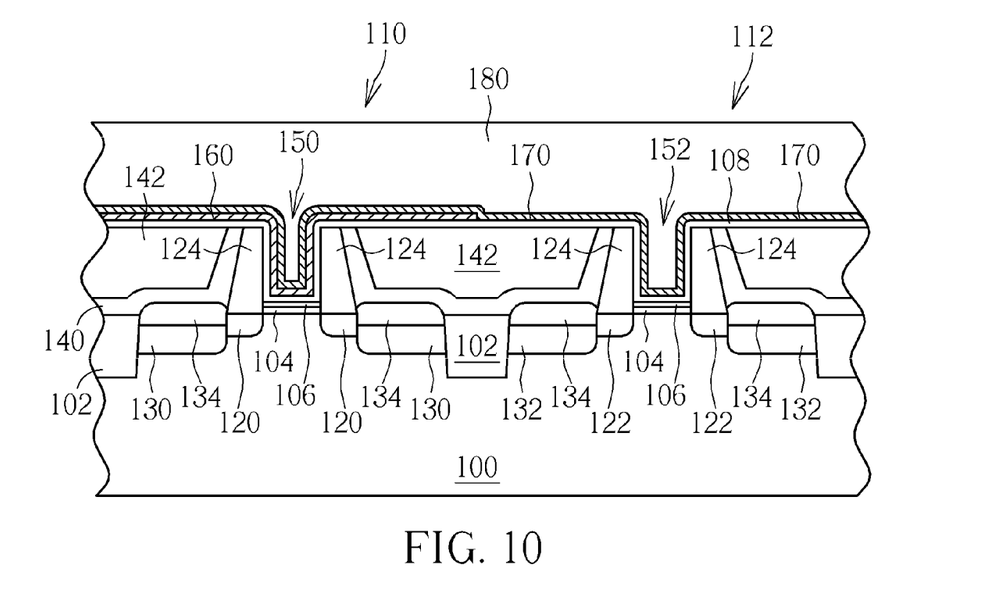

Please refer to FIG. 10. Next, a filling metal layer 180 is formed on the second work function metal layer 170 in both of the first gate trench 150 and the second gate trench 152. Additionally, a top barrier layer (not shown) is preferably formed between the second work function metal layer 170 and the filling metal layer 180. The top barrier layer can include TiN, but not limited to this. The filling metal layer 180 is formed to fill up the first gate trench 150 and the second gate trench 152. The filling metal layer 180 includes materials with low resistance and superior gap-filling characteristic, such as Al, TiAl, or titanium aluminum oxide (TiAlO), but not limited to this.

Subsequently, a planarization process, such as a chemical mechanical polishing (CMP) process is performed to remove unnecessary filling metal layer 180, second work function metal layer 170, first work function metal layer 160, and etch stop layer 108. Consequently, a first metal gate (not shown) and a second metal gate (not shown) are obtained. In addition, the ILD layer 140 and the CESL 142 can be selectively removed and sequentially reformed on the substrate 100 for improving performance of the semiconductor devices 110/112 in the preferred embodiment.

According to the manufacturing method for a metal gate provided by the present invention, the p-type or n-type work function metal layer having the intrinsic work function is formed in the corresponding p-type or n-type semiconductor device and followed by performing the ion implantation to implant specific dopants into the p-type or n-type work function metal layer. Thus the intrinsic work function is adjusted to a target work function that fulfills the requirement to a metal gate of the p-type or n-type semiconductor device. In other words, the manufacturing method for a metal gate provided by the present invention ensures the p-type or n-type semiconductor device obtains a metal gate having the work function fulfilling its requirement and thus ensures the performance of the p-type or n-type semiconductor device.

Those skilled in the art will readily observe that numerous modifications and alterations of the device and method may be made while retaining the teachings of the invention.

What is claimed is:
1. A manufacturing method for a metal gate comprising:
  providing a substrate having at least a semiconductor device with a conductivity type formed thereon, wherein the semiconductor device further comprises at least a high-k gate dielectric layer, a bottom barrier layer, and an etch stop layer;
  forming a gate trench in the semiconductor device, and the etch stop layer is exposed in a bottom of the gate trench;
  forming a work function metal layer having the conductivity type and an intrinsic work function corresponding to the conductivity type in the gate trench; and performing an ion implantation to adjust the intrinsic work function of the work function metal layer to a target work function.

2. The manufacturing method for a metal gate according to claim 1, wherein the conductivity type of the semiconductor device is a p-type.

3. The manufacturing method for a metal gate according to claim 1, wherein the work function metal layer comprises titanium nitride (TiN), titanium carbide (TiC), tantalum nitride (TaN), tantalum carbide (TaC), tungsten carbide (WC), or aluminum titanium nitride (TiAlN).

4. The manufacturing method for a metal gate according to claim 3, wherein the ion implantation comprises implanting aluminum (Al), nitrogen (N), chlorine (Cl), oxygen (O), fluorine (F), or bromine (Br).

5. The manufacturing method for a metal gate according to claim 2, wherein the target work function is between 4.9 eV and 5.2 eV.

6. The manufacturing method for a metal gate according to claim 2, further comprising performing a thermal treatment after the ion implantation.

7. The manufacturing method for a metal gate according to claim 6, wherein the thermal treatment comprises introducing oxygen.

8. The manufacturing method for a metal gate according to claim 6, wherein the ion implantation is performed before forming the work function metal layer and the thermal treatment is performed after forming the work function metal layer.

9. The manufacturing method for a metal gate according to claim 6, wherein the ion implantation is performed after forming the work function metal layer.

10. The manufacturing method for a metal gate according to claim 1, wherein the conductivity type of the semiconductor device is an n-type.

11. The manufacturing method for a metal gate according to claim 10, wherein the work function metal layer comprises titanium aluminide (TiAl), zirconium aluminide (ZrAl), tungsten aluminide (WAl), tantalum aluminide (TaAl), or hafnium aluminide (HfAl).

12. The manufacturing method for a metal gate according to claim 11, further comprising:
forming the work function metal layer on the substrate and in the gate trench; and
performing an Al ion implantation to adjust a Al concentration of the work function metal layer.

13. The manufacturing method for a metal gate according to claim 11, further comprising:
forming a metal layer on the substrate and in the gate trench; and
performing an Al ion implantation to form the work function metal layer.

14. The manufacturing method for a metal gate according to claim 10, wherein the ion implantation comprises implanting lanthanum (La), zirconium (Zr), hafnium (Hf), titanium (Ti), aluminum (Al), niobium (Nb), or tungsten (W).

15. The manufacturing method for a metal gate according to claim 10, wherein the target work function is between 3.9 eV and 4.2 eV.

16. The manufacturing method for a metal gate according to claim 10, further comprising performing a nitrogen thermal treatment after the ion implantation.

17. The manufacturing method for a metal gate according to claim 16, wherein the ion implantation is performed before forming the work function metal layer and the nitrogen thermal treatment is performed after forming the work function metal layer.

18. The manufacturing method for a metal gate according to claim 16, wherein the ion implantation is performed after forming the work function metal layer.

19. The manufacturing method for a metal gate according to claim 1, further comprising forming a filling metal layer in the gate trench, the filling metal layer fills up the gate trench.

20. A manufacturing method for metal gates comprising:
providing a substrate having at least a first semiconductor device and a second semiconductor device formed thereon, the first semiconductor device having a first conductivity type, the second semiconductor device having a second conductivity type, and the first conductivity type and the second conductivity type being complementary;
forming a first gate trench and a second gate trench respectively in the first semiconductor device and the second semiconductor device;
forming a first work function metal layer in the first gate trench, the first work function metal layer having the first conductivity type and a first intrinsic work function corresponding to the first conductivity type;
performing a first ion implantation to adjust the first intrinsic work function to a first target work function;
removing a portion of the first work function metal layer to expose a bottom of the second gate trench;
forming a second work function metal layer in the second gate trench, the second work function metal layer having the second conductivity type and a second intrinsic work function corresponding to the second conductivity type; and
performing a second ion implantation to adjust the second intrinsic work function to a second target work function.

21. The manufacturing method for metal gates according to claim 20, wherein the first conductivity type of the first semiconductor device is a p-type.

22. The manufacturing method for metal gates according to claim 21, wherein the first work function metal layer includes TiN, TiC, TaN, TaC, WC, or TiAlN.

23. The manufacturing method for metal gates according to claim 21, wherein the first ion implantation comprises implanting Al, N, Cl, O, F, or Br.

24. The manufacturing method for metal gates according to claim 21, wherein the first target work function is between 4.9 eV and 5.2 eV.

25. The manufacturing method for metal gates according to claim 21, further comprising performing a thermal treatment after the first ion implantation.

26. The manufacturing method for metal gates according to claim 25, wherein the thermal treatment further comprises introducing oxygen.

27. The manufacturing method for metal gates according to claim 25, wherein the first ion implantation is performed before forming the first work function metal layer or after forming the first work function metal layer.

28. The manufacturing method for metal gates according to claim 20, wherein the second conductivity type of the second semiconductor device is an n-type.

29. The manufacturing method for metal gates according to claim 28, wherein the second work function metal layer comprises TiAl, ZrAl, WAl, TaAl, or HfAl.

30. The manufacturing method for metal gates according to claim 29, further comprising:
forming the second work function metal layer on the substrate and in the second gate trench; and
performing a Al ion implantation to adjust a Al concentration of the second work function metal layer.

31. The manufacturing method for metal gates according to claim 29, further comprising:
    forming a metal layer on the substrate and in the second gate trench; and
    performing a Al ion implantation to form the second work function metal layer.

32. The manufacturing method for metal gates according to claim 28, wherein the second ion implantation comprises implanting Al, Zr, Hf, Ti, Al, Nb, or W.

33. The manufacturing method for metal gates according to claim 28, wherein the second target work function is between 3.9 eV and 4.2 eV.

34. The manufacturing method for metal gates according to claim 20, further comprising performing a nitrogen thermal treatment after the second ion implantation.

35. The manufacturing method for metal gates according to claim 20, wherein the second ion implantation is performed before forming the second work function metal layer or after forming the second work function metal layer.

* * * * *